United States Patent [19]

Maeda et al.

[11] Patent Number: 4,692,351

[45] Date of Patent: Sep. 8, 1987

[54] METHOD AND APPARATUS FOR DRAWING A THICK FILM CIRCUIT

[75] Inventors: Yukio Maeda; Shinichi Kudo; Keiji Saeki, all of Osaka, Japan

[73] Assignee: Matsushita Electric Industrial Co., Ltd., Japan

[21] Appl. No.: 817,833

[22] PCT Filed: Apr. 15, 1985

[86] PCT No.: PCT/JP85/00199

§ 371 Date: Dec. 16, 1985

§ 102(e) Date: Dec. 16, 1985

[87] PCT Pub. No.: WO85/05005

PCT Pub. Date: Nov. 7, 1985

[30] Foreign Application Priority Data

Apr. 16, 1984 [JP] Japan .................................. 59-76008

[51] Int. Cl.[4] .......................... B05D 1/26; B05C 9/02; G01D 15/16; F04B 43/04

[52] U.S. Cl. .................................... 427/196; 427/286; 118/663; 118/410; 118/697; 346/140 R; 222/252; 417/413; 417/474

[58] Field of Search .......................... 427/96, 196, 286; 29/846; 118/323, 410, 415, 683, 697, 698; 222/252, 333, 255; 346/140 R; 417/413, 474, 505

[56] References Cited

U.S. PATENT DOCUMENTS

| 2,659,310 | 11/1953 | Ryba | 417/413 |
|---|---|---|---|
| 3,088,434 | 5/1963 | Sprague et al. | 118/410 |
| 3,381,623 | 5/1968 | Elliott | 417/413 |
| 3,781,907 | 12/1973 | Gerber | 346/140 R |
| 3,909,831 | 9/1975 | Marchio et al. | 118/697 |
| 3,961,599 | 6/1976 | Jones, Jr. | 118/410 |
| 4,485,387 | 11/1984 | Drumheller | 118/697 |
| 4,558,995 | 12/1985 | Furukawa et al. | 417/413 |

FOREIGN PATENT DOCUMENTS

| 2315319 | 1/1977 | France . | |
|---|---|---|---|
| WO84/01825 | 5/1984 | PCT Int'l Appl. . | |
| 531927 | 11/1976 | U.S.S.R. | 417/474 |
| 712530 | 1/1980 | U.S.S.R. | 417/474 |

OTHER PUBLICATIONS

IBM Technical Disclosure Bulletin, vol. 15, No. 10, Mar. 1973, pp. 3029-3030, New York, U.S.; R. Delio: "Extrusion Printing".

Primary Examiner—Lowell A. Larson
Attorney, Agent, or Firm—Lowe, Price, LeBlanc, Becker & Shur

[57] ABSTRACT

A method and apparatus for drawing a thick film circuit on a substrate (2) by discharging a paste from a paste discharge hole provided at one end of a drawing nozzle (1), the drawing nozzle (1) being located close to the substrate (2) and relatively moved with respect to the substrate (2). The discharge rate of the paste is controlled in accordance with the relatively moving speed between the drawing nozzle (1) and the substrate (2), thereby preventing variations of film thickness and line width caused by variations in the moving speed and making it possible to form a thick film circuit at a high speed and with high accuracy.

10 Claims, 7 Drawing Figures

METHOD AND APPARATUS FOR DRAWING A THICK FILM CIRCUIT

TECHNICAL FIELD

The present invention relates to a method and apparatus for drawing a thick film circuit wherein a thick film circuit including resistors, capacitors and electric conductors is drawn on a substrate by discharging a paste from a discharge hole of a drawing nozzle.

BACKGROUND OF THE INVENTION

A thick film circuit is suitable for many types of electronic equipment, such as broadcasting radio receivers, television receivers, video tape recorders, communication equipment, and measuring equipment.

Such a thick film circuit is generally formed using the screen printing method. More specifically, a desired pattern is formed on a substrate made of almina ceramic using a conductor paste, resistor paste and so on, followed by drying and heating so as to manufacture a thick film circuit. However, the screen printing method uses a mask pattern, with the result that a longer time is required for the exchange of mask pattern and cleaning of mask pattern and squeegee, and thus it is unsuitable for small lot production and frequent changes of the circuit formed.

On the other hand, a method which involves drawing on a moving substrate using a paste directly extruded from a nozzle without employing the mask pattern is reported in the "1978 International Microelectronics Symposium of ISHM, Minneapolis, MN, Sept. 17, 1978" and is introduced in the journal "Electronic Packaging and Production (January, 1981), Pages 98–109".

In operation, a drawing nozzle having a discharge hole for discharging a paste is kept at a certain distance from a substrate and is moved relative thereto to apply the paste for drawing a predetermined pattern of a thick film circuit. This drawing method does not require a mask pattern because the thick film circuit is drawn by means of NC control, thereby allowing the operator to quickly change the pattern and instantly modify the circuit.

However, one of problems with such a drawing method is that, when it is used to draw a continuous thick film circuit pattern having linear lines and curves, difficulty is encountered in drawing curve portions of the pattern at a high speed due to inertia of the drive system of the nozzle. Therefore, to efficiently form the thick film circuit by the above-described drawing method, it will necessary to draw linear portions at a high speed and curved portions at a relatively low speed. However, this technique does not produce satisfactory results because of the occurrence of variations in the film thickness and line width caused by the difference of moving speed of the nozzle between linear portions and curve portions. This problem will likewise be experienced in a method in which the substrate is moved without moving the drawing nozzle. Therefore, according to the conventional techniques, it is difficult to form the thick film circuit at a high speed and with high accuracy.

DISCLOSURE OF THE INVENTION

A primary object of the present invention is therefore to provide drawing method and apparatus which are capable of preventing variations of film thickness and line width due to the variations of the drawing speed.

Another object of the present invention is to provide drawing method and apparatus which are capable of drawing a thick film circuit at a high speed and with high accuracy, irrespective of the complexity of the drawing pattern.

These objects of the present invention are achieved by controlling the discharge rate of paste in accordance with the relative moving speed between a drawing nozzle and a substrate.

The present invention relates to a drawing method for drawing a thick film circuit, in which a drawing nozzle having a discharge hole at the end thereof is held close to a substrate for drawing a thick film circuit and a thick film circuit is drawn on the substrate by discharging a paste from the discharge hole and moving the drawing nozzle relative to the substrate. The method according to the present invention includes a method in which the moving speed of the drawing nozzle relative to the substrate is detected and the discharging amount of paste from the discharge hole is controlled in accordance with the detected moving speed.

A drawing apparatus according to the present invention comprises a drawing nozzle having a discharge hole of a paste, X-Y drive means for relatively moving the drawing nozzle and a substrate for drawing a thick film circuit on the substrate, up and down drive means for relatively moving the drawing nozzle and the substrate in directions perpendicular to the substrate, and control means for controlling the discharge rate of paste from the discharge hole and for controlling the X-Y drive means and the up and down drive means. The discharge amount of the paste from the discharge nozzle is controlled in accordance with the relatively moving speed between the drawing nozzle and substrate.

Furthermore, a drawing apparatus according to the present invention is also arranged to detect the relative moving speed between the drawing nozzle and substrate and to control the discharge rate of paste from the discharge hole in accordance with the detected relative moving speed.

DESCRIPTION OF THE PREFERRED EMBODIMENT

Figure 1:
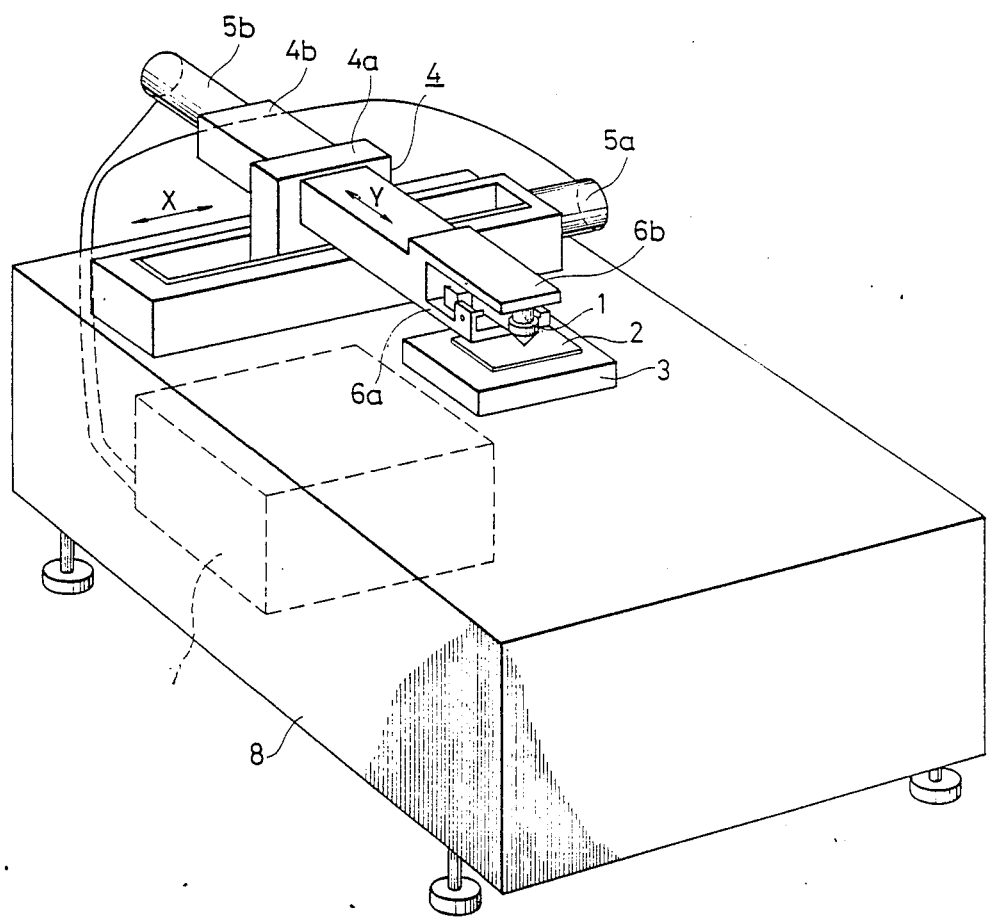
FIG. 1 is a perspective view showing the whole drawing apparatus for a thick film circuit according to a first embodiment of the present invention.

FIG. 1 illustrates the overall arrangement of a drawing apparatus according to an embodiment of the present invention. Drawing nozzle 1 has a paste therein and a discharge hole at the end thereof. A heat-resistant substrate 2 is provided for forming a thick film circuit thereon and is made of aluminous ceramic or the like, on a stage 3 for fixing the substrate 2, 4 representing an X-Y drive table for horizontally moving the drawing nozzle 1. The X-Y drive table comprises a X-axis drive section 4a and Y-axis drive section 4b, a lower support plate 6a for supporting the drawing nozzle 1 and an upper support plate 6b having a nozzle lifter being attached to one end of the Y-axis drive section 4b. A control unit 7 has a microprocessor and a memory for controlling the X-axis drive section 4a and Y-axis drive section 4b of the X-Y drive table and for controlling the amount of paste discharged from the discharge hole of the drawing nozzle 1. The X-axis drive section 4a and Y-axis drive section 4b respectively have a X-axis drive motor 5a and a Y-axis drive motor 5b. The position and speed of the X-axis drive section 4a and Y-axis drive section 4b are determined by controlling the rotations of the X-axis motor 5a and Y-axis motor 5b in accordance with the instructions from the microprocessor of the control unit 7 on the basis of information from respective encoders encased in the X-axis motor 5a and Y-axis motor 5b. Base 8 supports the above-noted parts.

Figure 2:
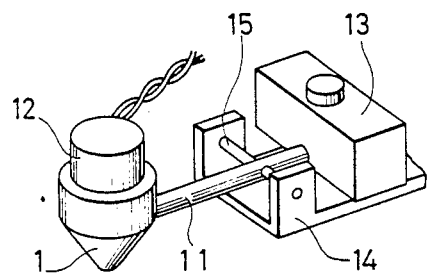
FIG. 2 is a perspective view illustrating a drawing nozzle of the drawing apparatus of FIG. 1.

The arrangement of the drawing nozzle 1 will now be described with reference to FIGS. 2 and 3.

A paste discharge hole 10 is provided at the end of the drawing nozzle 1, and is connected to one end of a paste supplying pipe 11 which also acts as a lever. A discharge pump 12 is attached at the upper portion of the drawing nozzle 1. The other end of the pipe 11 is coupled to a paste tank 13 for storing a paste 9. Arm 14 supports a bar 15 disposed to cross the pipe 11 so as to serves as a fulcrum for the pipe 11, so that the pipe 11 is freely rotatable. A nozzle lifter 27 comprising a magnet is attached to the upper supporting plate 6b. The discharge pump 12 comprises a circular movable film 16 made of a metal, a movable coil 17 connected to the center of the movable film 16, and a circular cup-shaped magnet 19 having a cylindrical projection. The magnet 19 is attached to a pump cover 18 so as not to come into contact with the movable coil 17. The circumference of the movable film 16 is hermetically held between the pump cover 18 and drawing nozzle 1. A valve 20 made of plastic film to prevent the flowing back of the paste 9 is attached to the connection between the pipe 11 and drawing nozzle 1.

Figure 3:
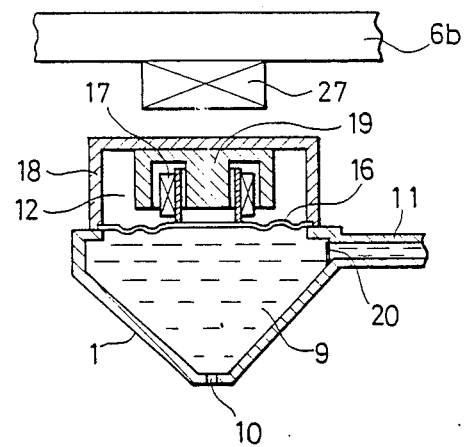
FIG. 3 is a cross-sectional view of the drawing nozzle of FIG. 2.

The drawing nozzle 1 is biased by a spring (not shown) and maintained in the state shown in FIG. 3. In response to completion of a drawing, current is passed through the nozzle lifter 27 comprising a magnet, and thus the pump cover 18, made of a magnetic material, is lifted. As a result, the drawing nozzle 1 is separated from the substrate and is moved upwardly.

Figure 4:
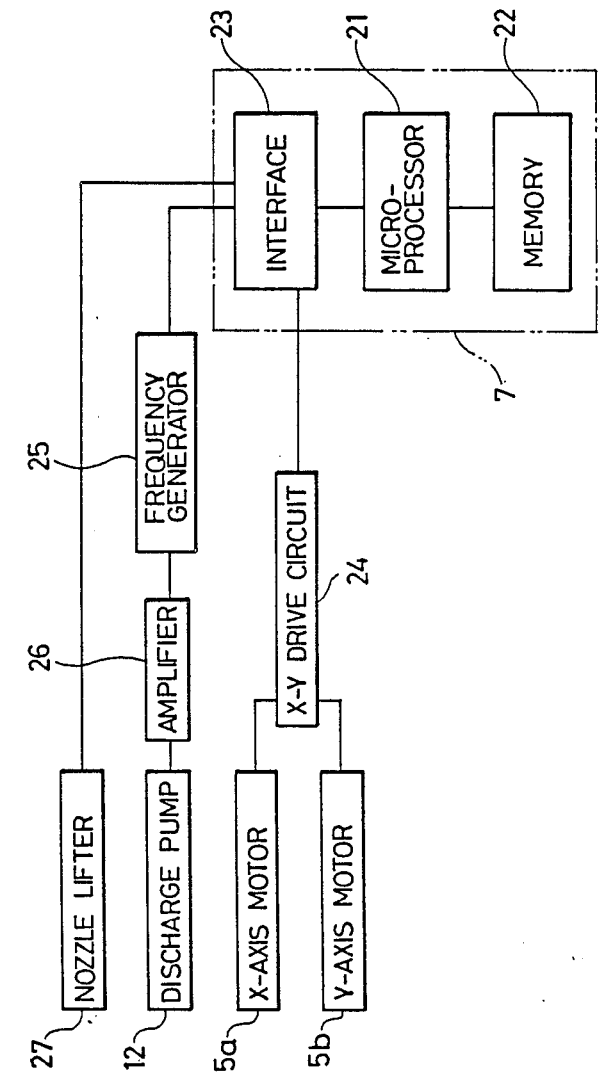
FIG. 4 is a block diagram showing a control system for the drawing apparatus of FIG. 1.

The control of the drawing apparatus will be described with reference to FIG. 4.

The microprocessor 21, using the memory 22, controls the nozzle lifter 27, discharge pump 12, and the X-axis motor 5a and Y-axis motor 5b of the X-Y drive table 4. An interface 23 further serves as a digital-to-analog converter. A position indicating signal and a speed indicating signal for the X-Y drive table outputted from the microprocessor 21 are supplied through the interface 23 to the X-Y drive circuit 24 and then reach the X-axis motor 5a and Y-axis motor 5b, whereby the operation of the X-Y drive table 4 is controlled by the microprocessor 21. A signal indicative of the discharge rate of paste is supplied from microprocessor 21 through the interface 23 to a frequency generator 25, followed by an alternating current signal having a frequency corresponding to the flow rate of paste to be discharged before the alternating voltage is amplified by an amplifier 26 and then supplied to the movable coil 17 of the discharge pump 12.

Figure 5:
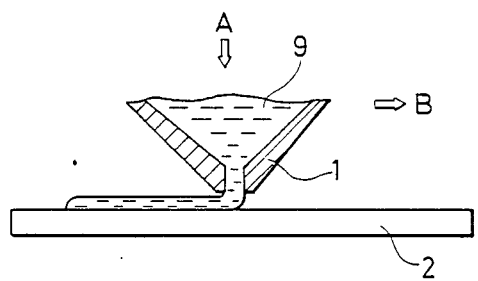
FIG. 5 is an illustration useful for describing a drawing method by means of the drawing apparatus.

FIG. 5 is an illustration for describing drawing by the above-mentioned drawing apparatus.

Referring to FIG. 5, the discharge pump 12 is driven in response to a signal from the control unit 7. The paste 9 is pushed in the direction of arrow A, thereby discharging it from the discharge hole 10 above the substrate 2. The drawing nozzle 1 is moved by the X-Y drive table 4 in the direction of arrow B to draw a thick film circuit on the substrate 2. On completion of the drawing, the discharge pump 12 is stopped and thereby the pressure in the direction of arrow A is released and discharging of the paste is terminated. The energization of the nozzle lifter 27 results in an operation such that the pump cover 18 is sucked by the nozzle lifter 27 and the drawing nozzle 1 is parted from the substrate 2 and is moved upwardly.

The thick film circuit drawn on the substrate 2 is dried to evaporate a solvent contained in the paste. For example, in the case of resistor paste, a thick film resistor is formed on the substrate 2 by heating it at a temperature of about 850° C.

Figure 6:
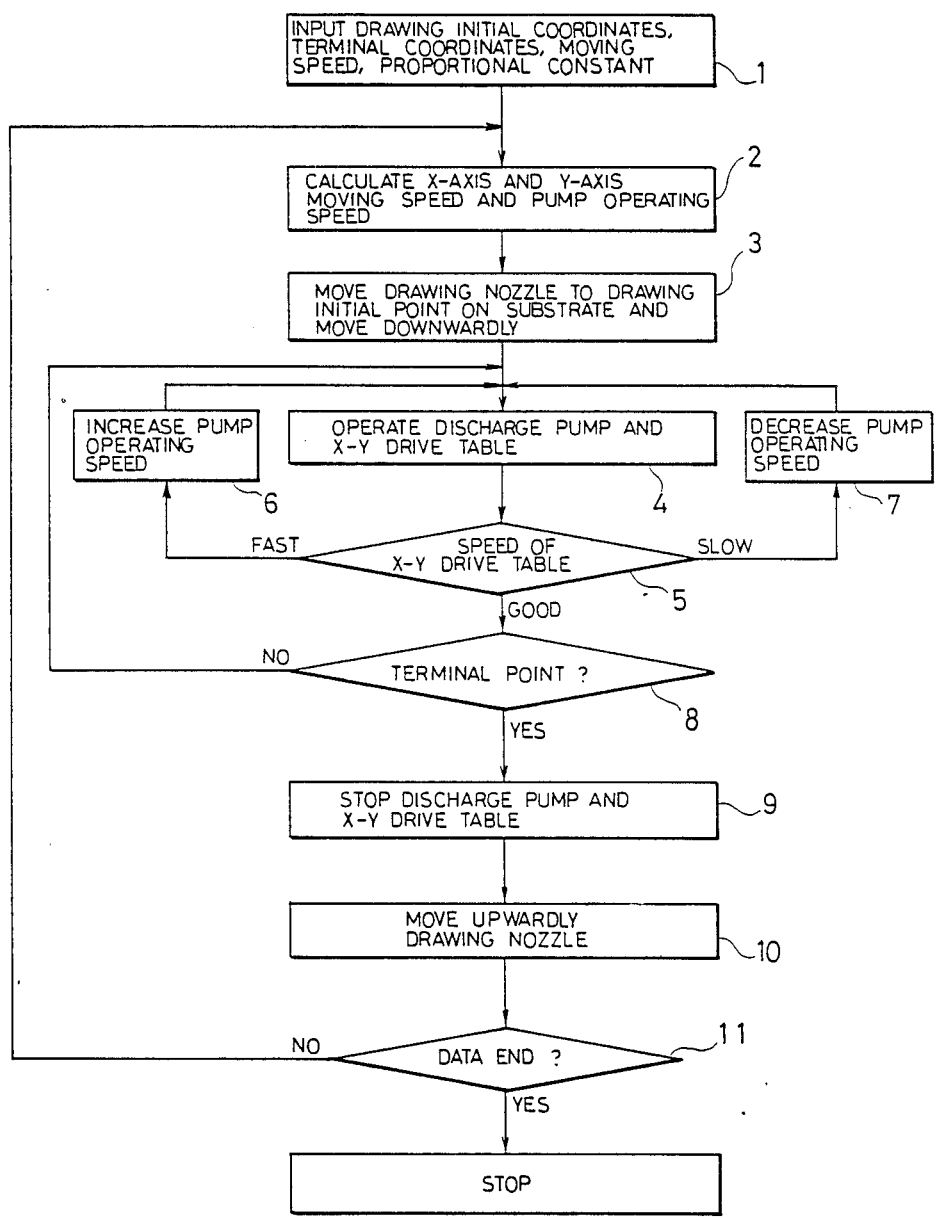
FIG. 6 is a flow chart for describing the operation of the drawing apparatus of FIG. 1.

An operation for drawing a thick film conductor by the above-noted drawing apparatus will be described with reference to the flow chart of FIG. 6.

First, the paste tank 13 is filled for example, with a silver-palladium conductive powder and a conductor paste whose principal component is glass frit and organic solvent. Secondly, as illustrated in FIG. 6, various data required for the drawing are stored in the memory 22 of the control unit 7 by means of a reader with a keyboard and a paper tape, or a reader with a magnetic disc (step 1). The moving speeds $V_{xo}$ and $V_{yo}$ of the X-axis drive section 4a and Y-axis drive section 4b, and the rotating speed (rpm) of each of X-axis motor 5a and Y-axis motor 5b are respectively calculated on the basis of the data, and the initial operating speed (=frequency) is calculated using a proportional constant and the calculated values of $V_{xo}$ and $V_{yo}$ (step 2).

The drawing nozzle 1 is moved by the X-Y drive table 4 to the initial point of drawing on the substrate 2 and the electro-magnetic action of the nozzle lifter 27 is terminated to move the drawing nozzle 1 downward to the substrate 2 by the bias force of the spring (step 3). The X-Y drive table 4 is driven, while at the same time the discharge pump 12 is driven to discharge the paste from the discharge hole 10, whereby the paste is applied so as to draw a desired shape on the substrate 2 (step 4).

In subsequent step 5, the respective rotating speeds of the X-axis motor 5a and Y-axis motor 5b are detected by encoders respectively provided therewith, and the actual moving speed of the drawing nozzle 1 is calculated on the basis of X-axis moving speed $V_x$ (mm/sec) and Y-axis moving speed $V_y$ (mm/sec). If $\sqrt{V_{xo}^2 + V_{yo}^2} < \sqrt{V_x^2 + V_y^2}$, control is performed so as to increase the operating speed of the pump 12 (step 6). If $\sqrt{V_{xo}^2 + V_{yo}^2} > \sqrt{V_x^2 + V_y^2}$, the operating speed thereof is decreased (step 7), and therefore the discharge amount Q (μl/sec) is kept so that $Q = k\sqrt{V_x^2 + V_y^2}$. The reference character k represents a proportional constant, and is determined on the basis of the line width and film thickness of the thick film circuit and the volumetric shrinkage rate due to the drying and heating of the thick film paste.

In the next step 8, as well as in the previous step 7, the microprocessor 21 checks the terminal point of the drawing on basis of the data obtained from the encoders of the respective X-axis motor 5a and Y-axis motor 5b. If this point is reached, the discharge pump 12 is stopped to terminate the discharge of the paste 9 and, at the same time, to terminate the operation of the X-Y drive table (step 9). Thereafter, the pump cover 18 made of a magnetic material is immediately lifted by the electro-magnetic action of the nozzle lifter 27 (step 10). In a step 11, it is checked whether there is additional drawing data or not. If there is the such data, the operational flow returns to the step 2 to continue drawing the thick film circuit. If not, the drawing of the thick film circuit is terminated.

The control of the discharge amount Q of the paste 9 is performed by the alternating current source supplied to the movable coil 17 of the discharge pump 12 in accordance with a signal from the microprocessor 21. The frequency of the alternating current source is in the range of 100 Hz to 1 kHz.

Even if the linear portions are drawn at the speed of 150 mm/sec and the curve portions are drawn at the speed of 30 mm/sec, the line width and film thickness of the continuously drawn thick film circuit pattern are respectively uniform and excellent in accuracy. In addition, the pattern is drawn in a short time.

A second embodiment of the present invention will be described with reference to FIG. 7.

Figure 7:
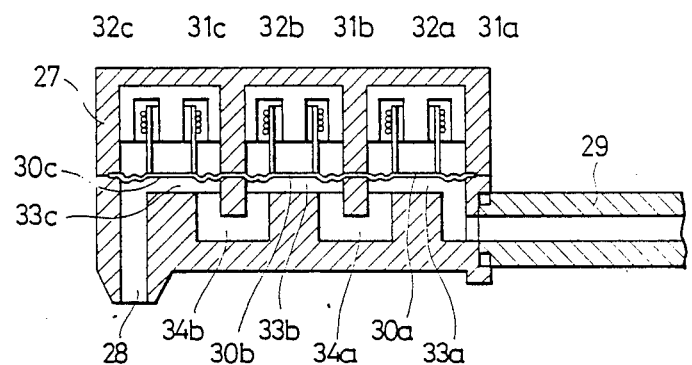
FIG. 7 is a cross-sectional view of a drawing nozzle according to another embodiment of the present invention.

FIG. 7 illustrates a drawing head which comprises a three-movable film type paste discharge pump 27, a paste discharge hole 28 communicating with the discharge pump 27, and a paste supplying pipe 29. The three-movable film type paste discharge pump 27 comprises movable films 30a, 30b, 30c which are equal in size, movable coils 31a, 31b, 31c, magnets 32a, 32b, 32c, pump chambers 33a, 33b, 33c, and connection paths for connecting between the pump chambers 34a, 34b, 34c. The pump chambers 33a, 33b, 33c are respectively connected to the connection paths 34a, 34b, 34c in series, and the paste is extruded by the operation of the paste discharge pump 27 from the pipe 29 through the pump chamber 33a, connection path 34a, pupm chamber 33b, connection path 34b, pump chamber 33c, and paste discharge hole 28. An alternating current source applied to the coil 31b is lagged with respect to that for the coil 31a by a phase difference of $2/3\pi$, and an alternating current source applied to the coil 31c is lagged with respect to that for the coil 31a by a phase difference of $4/3\pi$, thereby making possible to discharge the paste with high accuracy.

In the above-described embodiments, the movable film type pump has a movable coil as a driving source. However, it is possible to use a movable magnet as the driving source. Furthermore, it is also acceptable to use a ceramic vibrator as the driving source and to control the discharge amount in accordance with the amplitude of an alternating current source.

Furthermore, in the above-described embodiments, the drawing head is moved by the X-Y drive table. However, it is also acceptable that the substrate is moved by the X-Y drive table and, on the other hand, the drawing head is fixed.

INDUSTRIAL APPLICATION

As obvious from the above description, according to the present invention, since the paste discharge rate from the drawing nozzle is controlled in accordance with the relative moving speed of the drawing nozzle, a thick film circuit pattern having stable film thickness and line width can be drawn, irrespective of linear portions or curve portions. As a result, a complex pattern can be drawn at a high speed and with high accuracy.

What is claimed is:

1. A method for drawing a thick film circuit on a substrate by discharging a paste from a discharge hole provided at one end of a drawing nozzle, said drawing nozzle being located close to said substrate and being moved parallel relative to a surface of said substrate, said method comprising the steps of:

(a) determining in advance a desired relative moving speed of said drawing nozzle with respect to said substrate and a proportional constant to be used for obtaining a discharge rate of the paste corresponding to the desired relative moving speed of said drawing nozzle;

(b) detecting an actual relative moving speed of said drawing nozzle with respect to said substrate;

(c) comparing the detected actual relative moving speed with the desired relative moving speed of said drawing nozzle; and (d) correcting said discharge rate in accordance with the results of said comparison.

2. A method as claimed in claim 1, wherein:

a discharge rate Q of the paste is determined to satisfy the following equation:

$$Q = k \sqrt{V_x^2 + V_y^2}$$

(Q: $\mu$l/sec, $V_x$, $V_y$: mm/sec, k: $\mu$l/mm)
where k represents a proportional constant; and $V_x$ and $V_y$ represent the respective speeds of an X-axis drive section and a Y-axis drive section crossing at right angles to each other which are provided in an X-Y drive means for relatively moving said drawing nozzle and said substrate.

3. A method as claimed in claim 1, wherein:

said drawing nozzle is connected to a pump controlling the discharge rate of the paste.

4. An apparatus for drawing a thick film circuit, comprising:

a drawing nozzle having a paste discharge hole at one end thereof;

X-Y drive means for relatively moving said drawing nozzle and a substrate on which said thick film circuit is drawn, in directions parallel to said substrate;

up-and-down drive means for relatively moving said drawing nozzle and said substrate in a direction perpendicular to said substrate; and a control unit for controlling a paste discharge rate from said discharge hole, said control unit including means for determining in advance a desired relative moving speed of said drawing nozzle with respect to said substrate and a proportional constant to be used for obtaining a discharge rate of the paste corresponding to the desired relative moving speed of said drawing nozzle;

means for detecting an actual relative moving speed of said drawing nozzle with respect to said substrate;

means for comparing the detected actual relative moving speed with the desired relative moving speed of said drawing nozzle; and means for correcting said discharge rate in accordance with the results of said comparison.

5. An apparatus as claimed in claim 4, wherein:
a discharge rate Q of the paste is determined to satisfy the following equation:

$$Q = k\sqrt{V_x^2 + V_y^2}$$

(Q: μl/sec, $V_x$, $V_y$: mm/sec, k: μl/mm)
where
k represents a proportional constant;
$V_x$ and $V_y$ represent the respective speeds of an X-axis drive section and a Y-axis drive section crossing at right angles to each other which are provided in an X-Y drive means.

6. An apparatus as claimed in claim 4, wherein:
a control of the discharge rate is performed in accordance with instructions from a microprocessor in said control unit.

7. An apparatus as claimed in claim 4, further comprising:
pump means connected to said drawing nozzle for controlling the discharge rate of the paste.

8. An apparatus as claimed in claim 7, wherein:
said nozzle is formed to have a paste supplying opening and said pump means comprises a movable film coming into contact with paste in said drawing nozzle, a movable coil connected to said movable film, a magnet for vibrating said movable coil using an interaction relative to said movable coil, and a valve disposed at said paste supplying opening of said drawing nozzle for preventing a flowing-back of said paste.

9. An apparatus as claimed in claim 8, wherein:
said paste discharge rate is controlled in accordance with a variation of the vibration frequency of said movable film caused by varying the frequency of an alternating current for driving said pump.

10. An apparatus as claimed in claim 4, wherein:
the inside of said drawing nozzle is divided into three portions and connection paths are provided between said portions, each of said portions having a movable film coming into contact with the paste, a movable coil connected to said movable film, and a magnet for vibrating said movable coil by an interaction, each said movable coil being driven by alternating current sources which are respectively $2/3\pi$ degrees out-of-phase so that said paste is supplied from said paste supplying opening of said drawing nozzle.

* * * * *